United States Patent
Lim et al.

(10) Patent No.: US 9,978,825 B2
(45) Date of Patent: May 22, 2018

(54) CURVED DISPLAY DEVICE

(71) Applicant: LG Display Co., Ltd., Seoul (KR)

(72) Inventors: YuSok Lim, Seoul (KR); Sejun Cho, Gyeonggi (KR)

(73) Assignee: LG Display Co., ltd., Seoul (KR)

( * ) Notice: Subject to any disclaimer, the term of this patent is extended or adjusted under 35 U.S.C. 154(b) by 0 days. days.

(21) Appl. No.: 15/358,020

(22) Filed: Nov. 21, 2016

(65) Prior Publication Data

US 2017/0125501 A1 May 4, 2017

Related U.S. Application Data

(63) Continuation of application No. 14/551,271, filed on Nov. 24, 2014, now Pat. No. 9,525,012.

(30) Foreign Application Priority Data

Dec. 5, 2013 (KR) .......................... 10-2013-0151006

(51) Int. Cl.
*H01L 27/32* (2006.01)
*H01L 51/52* (2006.01)
*H01L 51/00* (2006.01)

(52) U.S. Cl.
CPC ...... *H01L 27/3262* (2013.01); *H01L 51/0097* (2013.01); *H01L 51/5237* (2013.01); *H01L 51/5246* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | |
|---|---|---|
| 4,474,432 A | 10/1984 | Takamatsu et al. |
| 6,420,200 B1 | 7/2002 | Yamazaki et al. |
| 6,452,341 B1 | 9/2002 | Yamauchi et al. |
| 6,583,472 B1 | 6/2003 | Shibata et al. |
| 6,587,086 B1 | 7/2003 | Koyama |
| 8,293,661 B2 | 10/2012 | Yamazaki |
| 8,378,393 B2 | 2/2013 | Sakata et al. |
| 8,476,719 B2 | 7/2013 | Endo et al. |
| 8,558,960 B2 | 10/2013 | Yamazaki et al. |
| 8,860,022 B2 | 10/2014 | Sasaki et al. |
| 8,878,173 B2 | 11/2014 | Yamazaki |
| 8,969,182 B2 | 3/2015 | Koezuka et al. |
| 9,000,443 B2 | 4/2015 | Hatano |
| 2001/0002703 A1 | 6/2001 | Koyama |
| 2001/0004190 A1 | 6/2001 | Nishi et al. |
| 2001/0038098 A1 | 11/2001 | Yamazaki et al. |

(Continued)

FOREIGN PATENT DOCUMENTS

JP 2009170173 A 7/2009

*Primary Examiner* — Asok K Sarkar
*Assistant Examiner* — Grant Withers
(74) *Attorney, Agent, or Firm* — Morgan, Lewis & Bockius LLP

(57) ABSTRACT

A curved display device including a display area and a non-display area is provided. The curved display device includes a first direction area configured to maintain a flat state and a bending area connected to the first direction area. A thin film transistor (TFT) layer, a passivation layer, a sealing layer, and an upper film are provided on a base substrate in an area where the display area overlaps the bending area, and the sealing layer and the upper film extend to an area where the non-display area overlaps the bending area.

16 Claims, 15 Drawing Sheets

(56) References Cited

U.S. PATENT DOCUMENTS

| | | |
|---|---|---|
| 2001/0040645 A1 | 11/2001 | Yamazaki |
| 2002/0050786 A1 | 5/2002 | Yamazaki et al. |
| 2002/0179908 A1 | 12/2002 | Arao |
| 2003/0057525 A1 | 3/2003 | Fock et al. |
| 2003/0094615 A1 | 5/2003 | Yamazaki et al. |
| 2003/0111666 A1 | 6/2003 | Nishi et al. |
| 2003/0162312 A1 | 8/2003 | Takayama et al. |
| 2003/0230764 A1 | 12/2003 | Yamazaki et al. |
| 2004/0185301 A1 | 9/2004 | Tsuchiya et al. |
| 2004/0263066 A1 | 12/2004 | Abe et al. |
| 2005/0095356 A1 | 5/2005 | Nakamura et al. |
| 2005/0197031 A1 | 9/2005 | Yamazaki et al. |
| 2005/0212420 A1 | 9/2005 | Sakakura et al. |
| 2005/0263775 A1 | 12/2005 | Ikeda et al. |
| 2006/0001366 A1 | 1/2006 | Chung et al. |
| 2006/0043510 A1 | 3/2006 | Yamazaki et al. |
| 2006/0284204 A1 | 12/2006 | Yamazaki et al. |
| 2007/0158656 A1 | 7/2007 | Lee et al. |
| 2007/0176161 A1 | 8/2007 | Seo et al. |
| 2008/0042940 A1 | 2/2008 | Hasegawa |
| 2008/0122349 A1 | 5/2008 | Kim et al. |
| 2009/0004772 A1 | 1/2009 | Jinbo et al. |
| 2009/0051640 A1 | 2/2009 | Tanaka et al. |
| 2009/0128030 A1 | 5/2009 | Kai et al. |
| 2010/0026952 A1 | 2/2010 | Miura et al. |
| 2010/0096633 A1 | 4/2010 | Hatano et al. |
| 2010/0171683 A1 | 7/2010 | Huitema et al. |
| 2010/0253902 A1 | 10/2010 | Yamazaki et al. |
| 2010/0277448 A1 | 11/2010 | Okamoto et al. |
| 2010/0293782 A1 | 11/2010 | Yamazaki et al. |
| 2011/0007042 A1 | 1/2011 | Miyaguchi |
| 2011/0089819 A1 | 4/2011 | Mo et al. |
| 2011/0263083 A1 | 10/2011 | Yamazaki |
| 2012/0146886 A1 | 6/2012 | Minami et al. |
| 2012/0262660 A1 | 10/2012 | Fujiwara et al. |
| 2012/0287026 A1 | 11/2012 | Masuda |
| 2012/0305952 A1 | 12/2012 | Takei |
| 2013/0034685 A1 | 2/2013 | An et al. |
| 2013/0056784 A1 | 3/2013 | Lee et al. |
| 2013/0140547 A1 | 6/2013 | Lee et al. |
| 2013/0147727 A1 | 6/2013 | Lee et al. |
| 2014/0042406 A1 | 2/2014 | Degner et al. |
| 2014/0049742 A1 | 2/2014 | Misono |
| 2014/0055702 A1 | 2/2014 | Park et al. |
| 2014/0055924 A1 | 2/2014 | Baek et al. |
| 2014/0098005 A1 | 4/2014 | Kim et al. |
| 2014/0131682 A1 | 5/2014 | Kim et al. |
| 2014/0131683 A1 | 5/2014 | Kim et al. |
| 2014/0183473 A1 | 7/2014 | Lee et al. |
| 2014/0197380 A1 | 7/2014 | Sung et al. |
| 2014/0217373 A1 | 8/2014 | Youn et al. |
| 2014/0299884 A1 | 10/2014 | Park et al. |
| 2014/0312319 A1 | 10/2014 | Kim |
| 2014/0346474 A1 | 11/2014 | Jeong et al. |
| 2015/0034932 A1 | 2/2015 | Choi |
| 2015/0060778 A1 | 3/2015 | Kim et al. |
| 2015/0060815 A1 | 3/2015 | Sato |
| 2015/0102298 A1 | 4/2015 | Namkung et al. |
| 2015/0115229 A1 | 4/2015 | Jung |
| 2015/0115248 A1 | 4/2015 | Chun et al. |
| 2015/0115253 A1 | 4/2015 | Ha et al. |
| 2015/0154898 A1 | 6/2015 | Jung et al. |
| 2016/0155757 A1 | 6/2016 | Yamazaki |

CURVED DISPLAY DEVICE

CROSS-REFERENCE TO RELATED APPLICATIONS

This application is a continuation of U.S. patent application Ser. No. 14/551,271, filed Nov. 24, 2014. This application also claims the benefit of Korean Patent Application No. 10-2013-0151006 filed on Dec. 5, 2013, which is hereby incorporated by reference as if fully set forth herein.

BACKGROUND OF THE INVENTION

Field of the Invention

The present invention relates to a curved display device, and more particularly, to a curved display device including a bending area.

Discussion of the Related Art

Since flexible display devices are bent and wound like paper, the flexible display devices are good in portability and maintenance, and thus are being continuously researched as next-generation display devices.

Due to some limitations, a fully wound display device is not practically used so far, but curved display devices having a certain curvature are already, practically used.

The curved display device described in this specification is not limited to the entirely-curved display device. That is, the curved display device described in this specification may include the partially-curved display device including a bending region.

FIG. 1 is a schematic cross-sectional view of a related art curved display device.

As seen in FIG. 1, the related art curved display device 1 has a structure in which a central portion is not bent, and only portions near both ends are bent. Therefore, the related art curved display device 1 includes a bending area which is formed near each of the both ends.

The related art curved display device 1 has a problem in which the bending area is damaged in a process of bending portions near the both ends. For this reason, there is a limitation in reducing a curvature radius of the bending area.

SUMMARY OF THE INVENTION

Accordingly, the present invention is directed to provide a curved display device that substantially obviates one or more problems due to limitations and disadvantages of the related art.

An object of the present invention is to provide a curved display device that can minimize a problem in which a bending area is damaged.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a curved display device, which includes a display area and a non-display area, comprises a first direction area configured to maintain a flat state; and a bending area connected to the first direction area, wherein, a thin film transistor (TFT) layer, a passivation layer, a sealing layer, and an upper film are provided on a base substrate in an area where the display area overlaps the bending area, and the sealing layer and the upper film extend to an area where the non-display area overlaps the bending area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

In this disclosure below, the term "on" should be construed as including a case where one element is formed at a top of another element and moreover a case where a third element is disposed therebetween.

Hereinafter, embodiments of the present invention will be described in detail with reference to the accompanying drawings.

Figure 1:
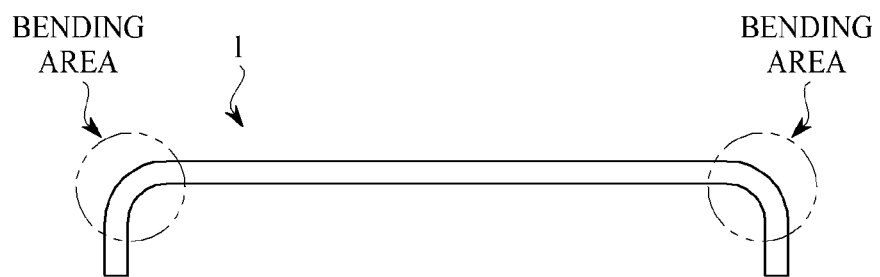
FIG. 1 is a schematic cross-sectional view of a related art curved display device.
Figure 2A:
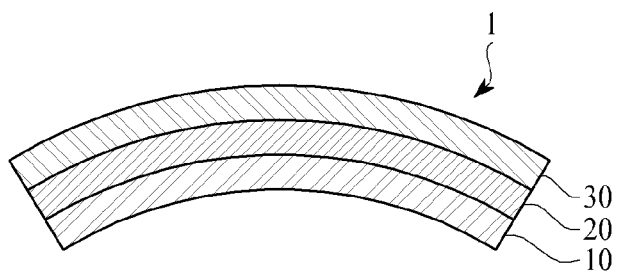
FIGS. 2A and 2B are diagrams for describing a method for minimizing a problem in which a bending area according to an embodiment of the present invention is damaged.
Figure 2B:
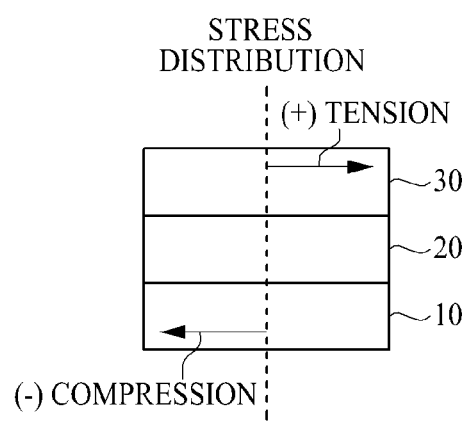

FIGS. 2A and 2B are diagrams for describing a method for minimizing a problem in which a bending area according to an embodiment of the present invention is damaged.

As seen in FIGS. 2A and 2B, when a display device 1 which includes a lower layer 10, an intermediate layer 20, and an upper layer 30 is bent in a down direction, a tensile force is applied to the upper layer 30, and a compressive force is applied to the lower layer 10. However, a tensile force and a compressive force are not applied to the intermediate layer 20 in theory. Therefore, there may be a possibility that the lower layer 10, the intermediate layer 20, and the upper layer 30 are all damaged in bending the display device 1, but since there is no force (tensile force and compressive force) applied to the intermediate layer 20 in theory, it can be expected that the intermediate layer 20 is not damaged, or is relatively less damaged.

Therefore, according to an embodiment of the present invention, among a plurality of layers configuring the display device 1, a layer (for example, a layer formed of an inorganic material) having a high possibility of damage caused by bending is disposed at a central portion of the display device 1.

Hereinafter, a method of applying the above-described idea will be described in more detail with an organic light emitting display device as an example.

Figure 3:
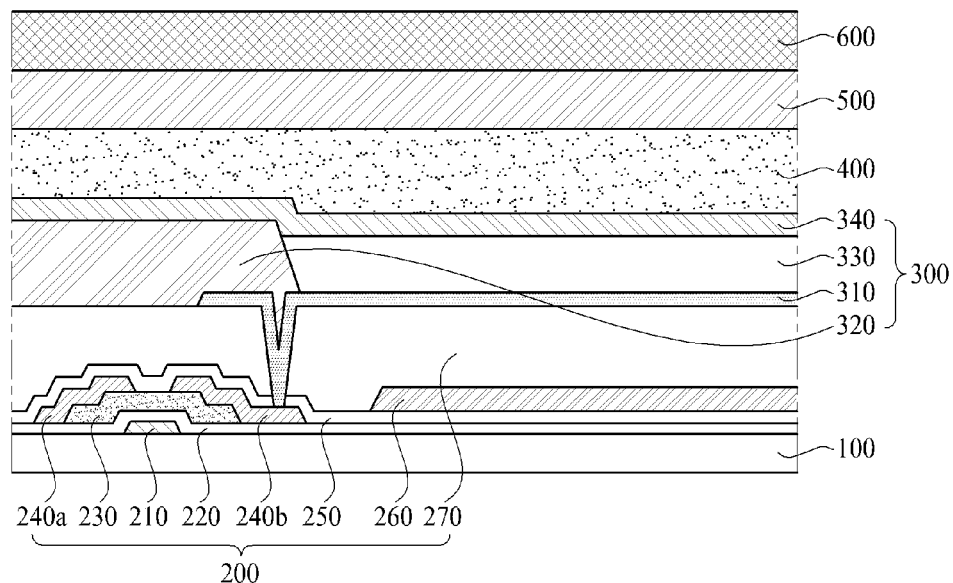
FIG. 3 is a cross-sectional view of a curved organic light emitting display device according to an embodiment of the present invention, and illustrates a flat state before a bending process.

FIG. 3 is a cross-sectional view of a curved organic light emitting display device according to an embodiment of the present invention, and illustrates a flat state before a bending process.

As seen in FIG. 3, an organic light emitting display device according to an embodiment of the present invention includes a base substrate 100, a thin film transistor (TFT) layer 200, a light emitting diode layer 300, a passivation layer 400, a sealing layer 500, and an upper film 600.

The base substrate 100 may use glass or transparent plastic (for example, polyimide) which is bendable or flexible, but is not limited thereto.

The TFT layer 200 is formed on the base substrate 100. The TFT layer 200 includes a plurality of lines, which include a gate line, a data line, and a power line for each pixel, and a switching TFT and a driving TFT which are connected to the plurality of lines. Also, a capacitor is formed by a combination of the lines and electrodes of the TFTs. Lines and a TFT which configure the TFT layer 200 may be changed to various forms known to those skilled in the art.

The driving TFT is illustrated in the drawing. In detail, a gate electrode 210 is formed on the base substrate 100, a gate insulating layer 220 is formed on the gate electrode 210, a semiconductor layer 230 is formed on the gate insulating layer 220, a source electrode 240a and a drain electrode 240b are formed on the semiconductor layer 230, a first protective layer 250 is formed on the source electrode 240a and the drain electrode 240b, a color filter 260 is formed on the first protective layer 250, and a second protective layer 270 is formed on the color filter 260. The driving TFT, having a bottom gate structure in which the gate electrode 210 is formed under the semiconductor layer 230, is illustrated in the drawing, but a driving TFT, having a top gate structure in which the gate electrode 210 is formed above the semiconductor layer 230, may be formed.

A position of the color filter 260 may be variously changed, and depending on the case, the color filter 260 may be omitted. To provide a detailed description, in a bottom emission type in which white light is emitted from the light emitting diode layer 300 and is output through the base substrate 100, as illustrated, the color filter 260 is formed under the light emitting diode layer 300. However, in a top emission type in which white light is emitted from the light emitting diode layer 300 and is output through the upper film 600, the color filter 260 is formed on the light emitting diode layer 300. Also, when red, green, or blue light is emitted from the light emitting diode layer 300, a separate color filter is not needed.

The light emitting diode layer 300 is formed on the TFT layer 200. The light emitting diode layer 300 includes a first electrode 310, a bank layer 320, an emission layer 330, and a second electrode 340. The first electrode 310 is formed on the second protective layer 270, and is connected to the drain electrode 240b of the driving TFT. The bank layer 320 is formed on the first electrode 310, and is pattern-formed in a matrix structure so as to define an emission area. The emission layer 330 is formed in the emission area defined by the bank layer 320. Although not shown in detail, the emission layer 330 may be formed in a structure where a hole injecting layer, a hole transporting layer, an organic emitting material layer, an electron transporting layer, and an electron injecting layer are sequentially stacked. Except the organic emitting material layer, one or more selected from the hole injecting layer, the hole transporting layer, the electron transporting layer, and the electron injecting layer may be omitted. The second electrode 340 is formed on the emission layer 330. The second electrode 340 may act as a common electrode, and thus may be formed on the bank layer 320 in addition to the emission layer 330.

The passivation layer 400 is formed on the light emitting diode layer 300. The passivation layer 400 protects the light emitting diode layer 300, and moreover prevents moisture from penetrating into the light emitting diode layer 300. The passivation layer 400 may be formed of a plurality of layers in which different inorganic materials are stacked, and may be formed of a plurality of layers in which an inorganic material and an organic material are alternately stacked.

The sealing layer 500 is formed on the passivation layer 400. The sealing layer 400 adheres the upper film 600 to the passivation layer 400, and prevents moisture from penetrating into the light emitting diode layer 300. The sealing layer 500 may be formed of various materials known to those skilled in the art. For example, the sealing layer 500 may be formed by using a barrier film structure such as a double-sided tape. Also, a liquid adhesive material such as a sealant may be coated, and then, the sealing layer 500 may be formed by hardening the coated liquid adhesive material.

The upper film 600 is formed on the sealing layer 500. The upper film 600 may be formed of a protective film, a polarizing film for anti-reflection, or a touch screen film in which a touch electrode is formed.

As described above, a layer formed of an inorganic material has a relatively high possibility that the layer is damaged by bending, and thus, when the layer formed of the inorganic material is an intermediate layer of the organic light emitting display device, damage which occurs in bending the organic light emitting display device can be minimized.

Among the layers of FIG. 3, layers including an inorganic material are the TFT layer 200 and the passivation layer 400. That is, in the TFT layer 200, the gate insulating layer 220 and the first protective layer 250 may be formed of an inorganic material, and the passivation layer 400 may include a plurality of inorganic materials. Therefore, when the TFT layer 200 or the passivation layer 400 is disposed at a central portion of the organic light emitting display device, damage can be minimized in bending the organic light emitting display device.

Figure 4A:
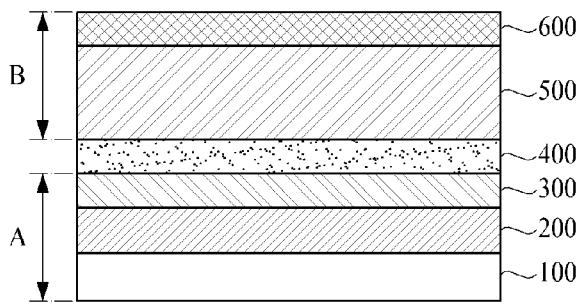
FIGS. 4A and 4B are schematic views of a curved organic light emitting display device according to various embodiments of the present invention.
Figure 4B:
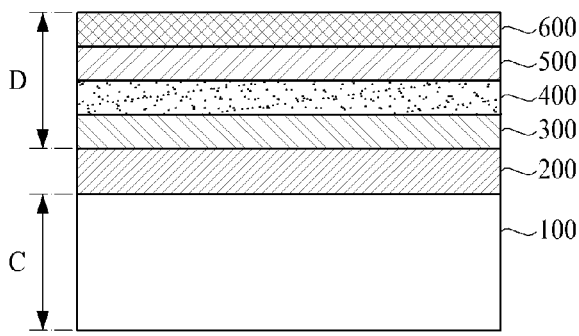

FIGS. 4A and 4B are schematic views of a curved organic light emitting display device according to various embodiments of the present invention.

As seen in FIG. 4A, in the organic light emitting display device including the base substrate 100, the TFT layer 200, the light emitting diode layer 300, the passivation layer 400, the sealing layer 500, and the upper film 600, the passivation layer 400 may be disposed at a central portion of the organic light emitting display device. That is, in FIG. 4A, a sum A of thicknesses of the base substrate 100, the TFT layer 200, and the light emitting diode layer 300 is equal to a sum B of thicknesses of the sealing layer 500 and the upper film 600. In this case, the TFT layer 200, the light emitting diode layer 300, and the upper film 600 have a limitation in adjusting a thickness, and thus, the sum A may match the sum B by appropriately adjusting thicknesses of the base substrate 100 and the sealing layer 500.

As seen in FIG. 4B, in the organic light emitting display device including the base substrate 100, the TFT layer 200, the light emitting diode layer 300, the passivation layer 400, the sealing layer 500, and the upper film 600, the TFT layer 200 may be disposed at a central portion of the organic light emitting display device. That is, in FIG. 4B, a thicknesses C of the base substrate 100 is equal to a sum D of thicknesses of the light emitting diode layer 300, the passivation layer 400, the sealing layer 500, and the upper film 600. In this case, the light emitting diode layer 300 and the upper film 600 have a limitation in adjusting a thickness, and thus, the thickness C may match the sum D by appropriately adjusting thicknesses of the base substrate 100, the passivation layer 400, and the sealing layer 500.

Figure 5:
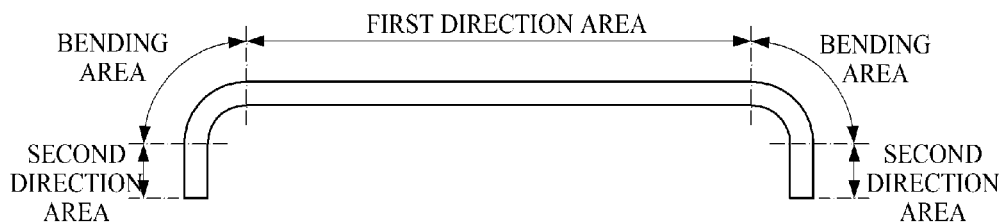
FIG. 5 is a schematic cross-sectional view of a curved display device according to another embodiment of the present invention.

FIG. 5 is a schematic cross-sectional view of a curved display device according to another embodiment of the present invention.

As seen in FIG. 5, the curved display device according to another embodiment of the present invention includes a first direction area, a bending area, and a second direction area.

The first direction area corresponds to a central area of a display device. The first direction area is an area which maintains a flat state before and after a bending process, and is an area which is not damaged in the bending process. Therefore, a full color image is displayed in the first direction area.

The bending area corresponds to an area between the first direction area and the second direction area. The bending area is connected to the first direction area and the second direction area. The bending area is an area which is bent to have a certain curvature, and is an area which is damaged in the bending process. Therefore, the bending area does not display an image, or even though the bending area displays an image, the bending area displays an image which differs from an image displayed by the first direction area, and in more detail, displays a simpler image (for example, an image with a low resolution) than the image displayed by the first direction area.

The second direction area corresponds to an end area of the display device, and in more detail, corresponds to one end area and the other end area of the display device. The second direction area is connected to the bending area. The second direction area is an area which is not parallel to the first direction area. That is, the second direction area may be vertical to the first direction area, or may not be vertical to the first direction area, depending on a curvature of the bending area. The second direction area maintains a flat state before and after the bending process, but there is a possibility that the second direction area is damaged in the bending process. Therefore, the second direction area may display an image which is equal to an image displayed by the first direction area, or display a simpler image than the image displayed by the first direction area.

As described above, according to another embodiment of the present invention, the first direction area is an area which is not damaged in the bending process, the bending area is an area which is damaged in the bending process, and the second direction area is an area which is damaged or not in the bending process. Therefore, in another embodiment of the present invention, damage which occurs in the bending process can be minimized by appropriately adjusting detailed configurations of the first direction area, the bending area, and the second direction area. This will be described below in detail.

Figure 6:
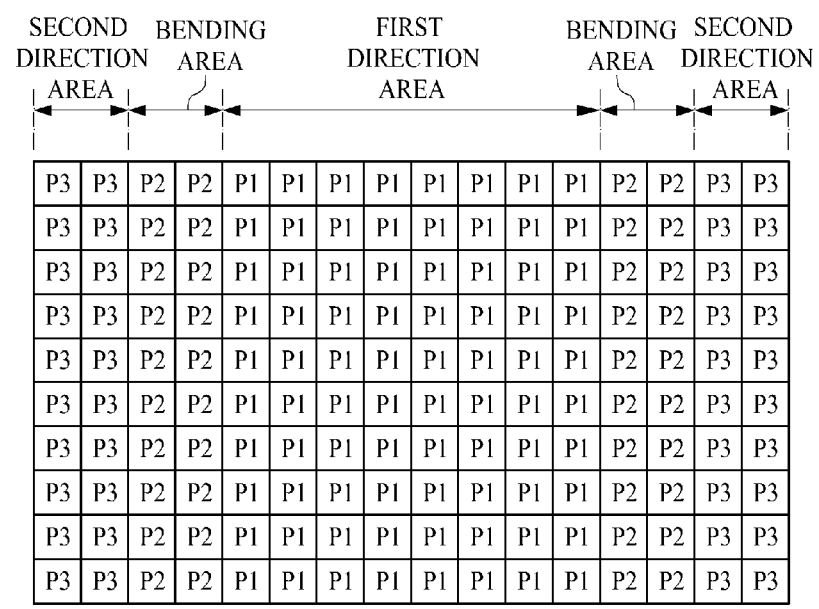
FIG. 6 is a schematic plan view of a curved display device according to another embodiment of the present invention.

FIG. 6 is a schematic plan view of a curved display device according to another embodiment of the present invention.

As seen in FIG. 6, a first direction area is formed at a central portion of a display device, a bending area is connected to the first direction area, and a second direction area is connected to the bending area.

A plurality of first pixels P1, which display an image, are formed in the first direction area. Each of the first pixels P1 includes various lines, a TFT, and an light emitting diode which are used to display an image, and displays a full color image such as a photograph or a moving image. A detailed configuration of each first pixel P1 will now be described.

As described above with reference to FIG. 3, the organic light emitting display device displays an image by light emitted from the light emitting diode layer 300 with a switching operation of the TFT layer 200. To this end, each first pixel P1 includes a pixel circuit and a compensation circuit.

The pixel circuit allows a data current, corresponding to a data voltage supplied through the data line, to flow in the light emitting diode layer 300 in response to a gate signal supplied through the gate line. To this end, the pixel circuit includes a switching transistor, a driving transistor, and at least one capacitor. The switching transistor is turned on according to the gate signal supplied through the gate line, and supplies the data voltage, supplied from the data line, to the driving transistor. The driving transistor is turned on with the data voltage supplied from the switching transistor, and supplies the data current based on the data voltage to the light emitting diode layer 300, thereby allowing the light emitting diode layer 300 to emit light in proportion to the data current. The at least one capacitor holds the data voltage, supplied to the driving transistor, during one frame.

In the pixel circuit, there is a problem in which a threshold voltage deviation of the driving transistor occurs due to a driving time of the driving transistor, and for this reason, a quality of an image is degraded. The compensation circuit is for compensating for a threshold voltage of the driving transistor. The compensation circuit may be divided into an internal compensation type and an external compensation type. A compensation circuit having the internal compensation type is configured with at least one compensation transistor and at least one compensation capacitor which are formed in the pixel circuit, and stores the data voltage and the threshold voltage of the driving transistor in the capacitor during a detection period, in which the threshold voltage of the driving transistor is detected, to compensate for the threshold voltage of the driving transistor. A compensation circuit having the external compensation type includes a sensing transistor connected to the driving transistor of the pixel circuit, a sensing line which is connected to the sensing transistor and is formed in a display panel, and a sensing circuit connected to the sensing line. The compensation circuit having the external compensation type senses the threshold voltage of the driving transistor when the sensing transistor is driven, and compensates for data, which is to be displayed in each pixel, based on the sensed threshold voltage of the driving transistor, thereby compensating for the threshold voltage of the driving transistor.

As described above, a plurality of lines and a plurality of transistors which configure the pixel circuit and the compensation circuit are formed in each first pixel P1, and the light emitting diode layer 300 emits light according to operations of the elements to allow a full color image such as a photograph or a moving image to be displayed.

A plurality of second pixels P2, which display an image, are formed in the bending area. The second pixels P2 have a configuration which differs from those of the first pixels P1, and in more detail, are more simply configured than the first pixels P1. Therefore, the second pixels P2 may display, in the second direction area, only an image such as a simple letter instead of a full color image such as a photograph or a moving image. In other words, the number of lines or TFTs of the second pixels P2 is reduced in comparison with the first pixels P1, and thus, the second pixels P2 display an image based on a simple on/off driving operation.

That is, the number of lines configuring a pixel circuit and a compensation circuit which are included in each of the second pixels P2 may be less than the number of lines configuring the pixel circuit and the compensation circuit which are included in each first pixel P1. Also, the number of transistors configuring the pixel circuit and the compensation circuit which are included in each second pixel P2 may be less than the number of transistors configuring the pixel circuit and the compensation circuit which are included in each first pixel P1. Also, the compensation circuit may not be provided in the second pixels P2. Depending on the case, a transistor is not formed in each second pixel P2, and thus, the bending area may be configured in a passive matrix type instead of an active matrix type.

A plurality of third pixels P3, which display an image, are formed in the second direction area. The third pixels P3 may have the same configuration as that of each first pixel P1. That is, the third pixels P3 are configured identically to the first pixels P1, and thus, similarly to the first direction area, the second direction area may display a full color image such as a photograph or a moving image.

The third pixels P3 have a configuration which differs from those of the first pixels P1, and in more detail, are more simply configured than the first pixels P1. Therefore, the third pixels P3 may display, in the second direction area, an image such as a simple letter instead of a full color image such as a photograph or a moving image. In other words, the number of lines or TFTs of the third pixels P3 is reduced in comparison with the first pixels P1, and thus, the third pixels P3 display an image based on a simple on/off driving operation. That is, the number of lines configuring a pixel circuit and a compensation circuit which are included in each of the third pixels P3 may be less than the number of lines configuring the pixel circuit and the compensation circuit which are included in each first pixel P1. Also, the number of transistors configuring the pixel circuit and the compensation circuit which are included in each third pixel P3 may be less than the number of transistors configuring the pixel circuit and the compensation circuit which are included in each first pixel P1. Also, the compensation circuit may not be provided in the third pixels P3. Depending on the case, a transistor is not formed in each third pixel P3, and thus, the second direction area may be configured in the passive matrix type instead of the active matrix type.

The third pixels P3 may have the same configuration as that of each second pixel P2, or may have a configuration which differs from that of each second pixel P2.

Figure 7:
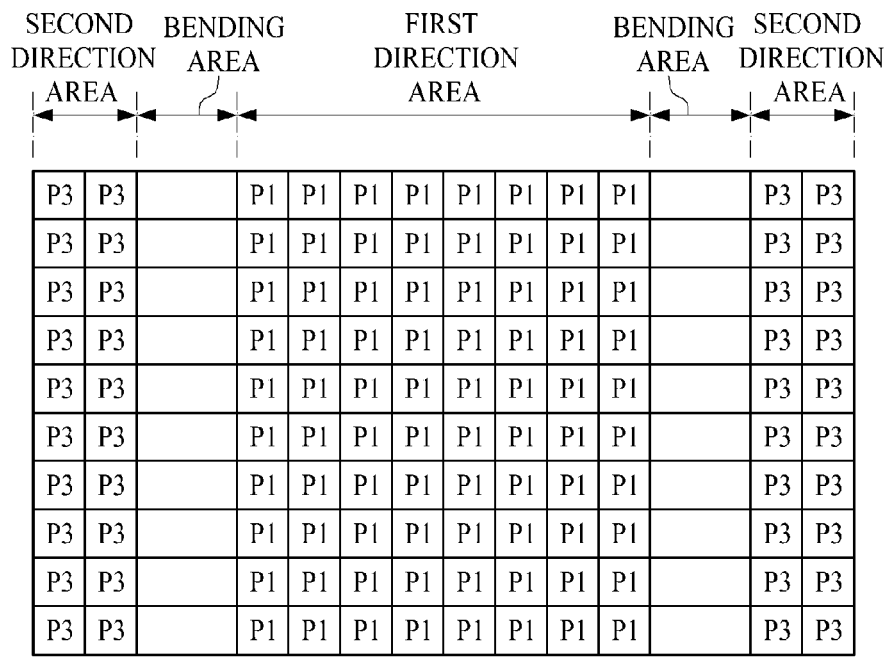
FIG. 7 is a schematic plan view of a curved display device according to another embodiment of the present invention.

FIG. 7 is a schematic plan view of a curved display device according to another embodiment of the present invention. Except that a configuration of a bending area is changed, the curved display device of FIG. 7 is the same as the curved display device of FIG. 6. Therefore, a different configuration will be described below.

As seen in FIG. 7, a pixel for displaying an image is not formed in a bending area. That is, only a line for electrically connecting a first direction area to a second direction area is formed in the bending area, and a TFT and a light emitting diode layer for displaying an image are not formed in the bending area.

Figure 8:
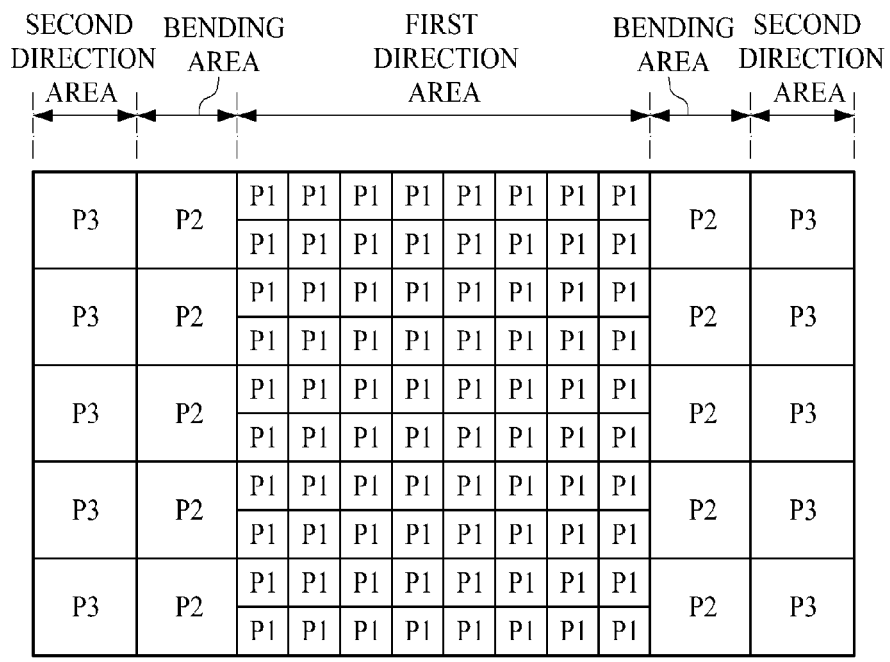
FIG. 8 is a schematic plan view of a curved display device according to another embodiment of the present invention.

FIG. 8 is a schematic plan view of a curved display device according to another embodiment of the present invention. Except that configurations of a bending area and a second direction area are changed, the curved display device of FIG. 8 is the same as the curved display device of FIG. 6. Therefore, a different configuration will be described below.

As seen in FIG. 8, a first pixel P1 is formed in a first direction area, a second pixel P2 is formed in the bending area, and a third pixel P3 is formed in the second direction area. A size of the second pixel P2 and a size of the third pixel P3 are formed greater than that of the first pixel P1. Also, the size of the second pixel P2 may be the same as that of the third pixel P3, but the size of the second pixel P2 may be formed greater than that of the third pixel P3.

The second pixels P2 and the third pixels P3 may be formed to have the same configuration as that of each first pixel P1, or may be more simply configured than the first pixels P1. Therefore, the bending area and the second direction area may display an image such as a simple letter instead of a full color image such as a photograph or a moving image. A detailed method which is more simply configured than the first pixels P1 is as described above, and thus, a repetitive description is not provided.

Figure 9:
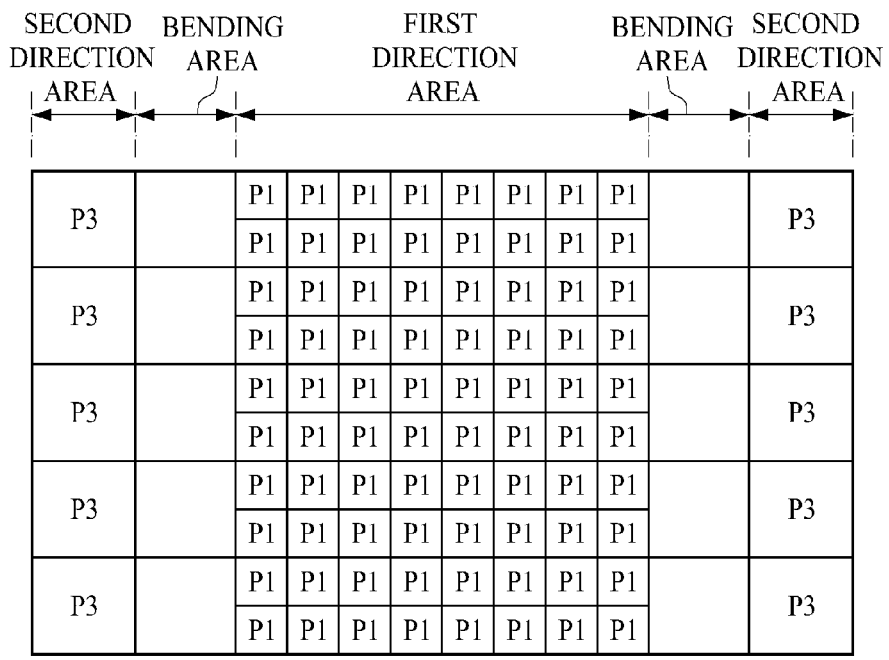
FIG. 9 is a schematic plan view of a curved display device according to another embodiment of the present invention.

FIG. 9 is a schematic plan view of a curved display device according to another embodiment of the present invention. Except that a configuration of a bending area is changed, the curved display device of FIG. 9 is the same as the curved display device of FIG. 8. Therefore, a different configuration will be described below.

As seen in FIG. 9, a pixel for displaying an image is not formed in the bending area. That is, only a line for electrically connecting a first direction area to a second direction area is formed in the bending area, and a TFT and a light emitting diode layer for displaying an image are not formed in the bending area.

According to the above-described curved display devices of FIGS. 6 to 9, a method of simplifying a configuration of a TFT is applied to the bending area and the second direction area. The passivation layer 400 instead of the TFT layer 200 may be used as an intermediate layer of each of the curved display devices of FIGS. 6 to 9. That is, the structure of FIG. 4A instead of the structure of FIG. 4B may be suitable for the curved display devices of FIGS. 6 to 9. To provide a description on this, as described above, layers having a high possibility of damage caused by bending are the TFT layer 200 and the passivation layer 400. In this case, when the passivation layer 400 is formed as an intermediate layer of the curved display device, a possibility that the passivation layer 400 is damaged is reduced. Also, when a structure of the TFT layer 200 is simplified in the bending area and the second direction area, a possibility that the TFT layer 200 is damaged is reduced.

The passivation layer 400 is not necessarily formed as the intermediate layer of each of the curved display devices of FIGS. 6 to 9, and the TFT layer 200 may be formed as the intermediate layer.

Figure 10:
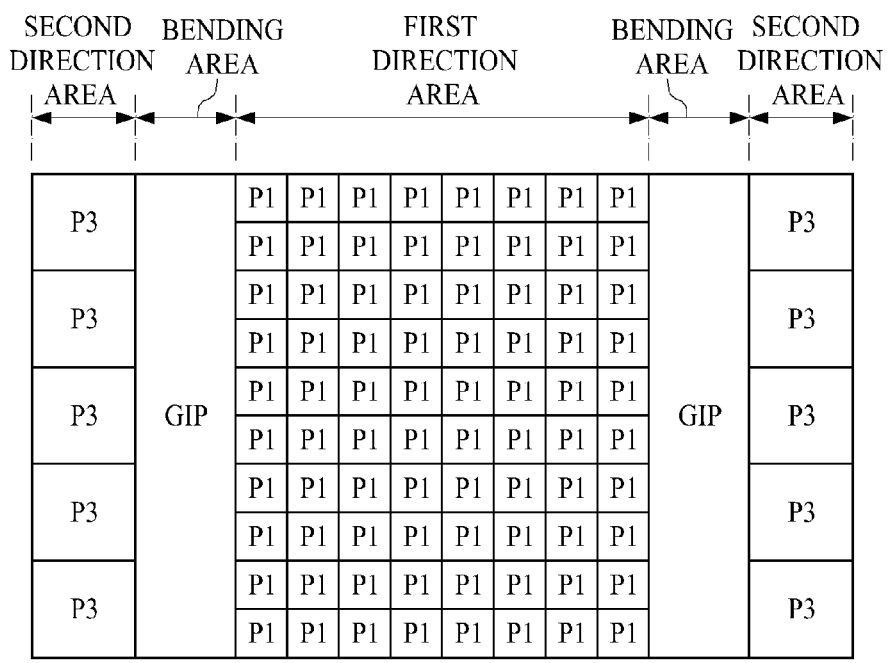
FIG. 10 is a schematic plan view of a curved display device according to another embodiment of the present invention.

FIG. 10 is a schematic plan view of a curved display device according to another embodiment of the present invention. Except that a configuration of a bending area is changed, the curved display device of FIG. 10 is the same as the curved display device of FIG. 8. Therefore, a different configuration will be described below.

As seen in FIG. 10, a pixel for displaying an image is not formed in the bending area, and thus, a TFT and an light emitting diode layer for displaying an image are not formed. Instead, a gate driving integrated circuit (IC) is mounted in the bending area, which is called a gate-in panel (GIP). In the related art, the gate driving IC is generally mounted in an edge area of a display device. However, according to another embodiment of the present invention, the gate driving IC is mounted in the bending area, and thus, a width of the edge area of the display device can be reduced. Therefore, a plurality of TFTs configuring the gate driving IC are formed in the bending area.

Figure 11:
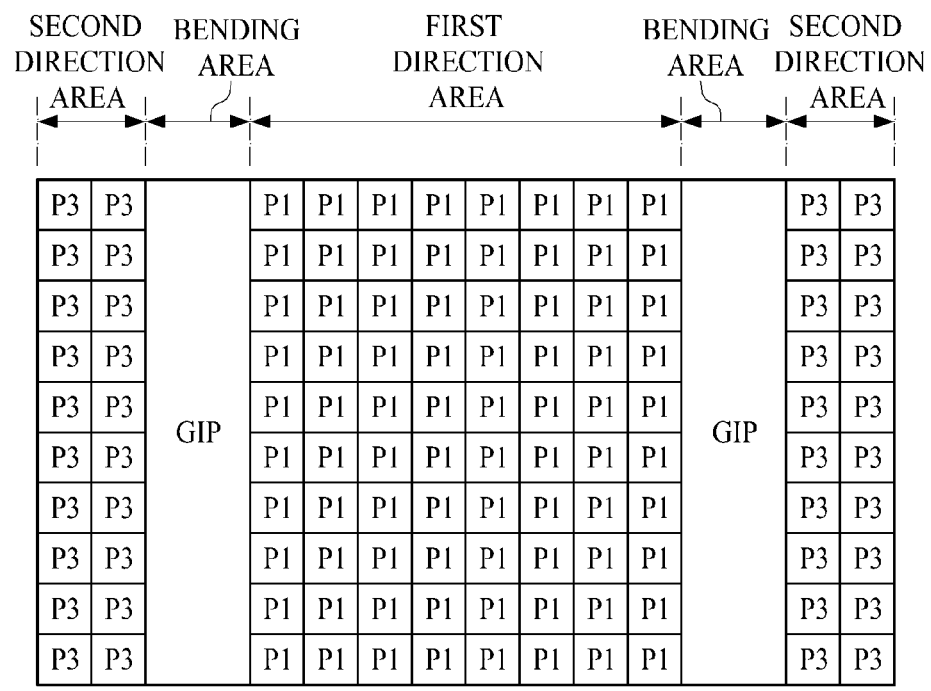
FIG. 11 is a schematic plan view of a curved display device according to another embodiment of the present invention.

FIG. 11 is a schematic plan view of a curved display device according to another embodiment of the present invention. Except that a configuration of a second direction area is changed, the curved display device of FIG. 11 is the same as the curved display device of FIG. 10. Therefore, a different configuration will be described below.

According to FIG. 10 as above, a size of a third pixel P3 which is formed in the second direction area is formed greater than a size of a first pixel P1 which is formed in a first direction area. On the other hand, according to FIG. 11, the size of the third pixel P3 which is formed in the second direction area is the same as the size of the first pixel P1 which is formed in the first direction area.

In the curved display device of FIG. 11, the third pixels P3 may be formed to have the same configuration as that of the first pixel P1, or may be more simply configured than the first pixels P1. Therefore, the second direction area may display an image such as a simple letter instead of a full color image such as a photograph or a moving image. A detailed method which is more simply configured than the first pixels P1 is as described above, and thus, a repetitive description is not provided.

According to the above-described curved display devices of FIGS. 10 and 11, the gate driving IC is mounted in the bending area, which is called the GIP. The TFT layer 200 instead of the passivation layer 400 may be used as an intermediate layer of each of the curved display devices of FIGS. 10 and 11. That is, the structure of FIG. 4B instead of the structure of FIG. 4A may be suitable for the curved display devices of FIGS. 10 and 11. In order for the gate driving IC to be mounted in the bending area, a plurality of TFTs may be formed in the bending area. Therefore, the TFT layer 200 is formed as an intermediate layer of the curved display device, and thus, despite that the plurality of TFTs are formed in the bending area, the plurality of TFTs can be prevented from being damaged.

The TFT layer 200 is not necessarily formed as the intermediate layer of each of the curved display devices of FIGS. 10 and 11, and the passivation layer 400 may be formed as the intermediate layer.

Figure 12:
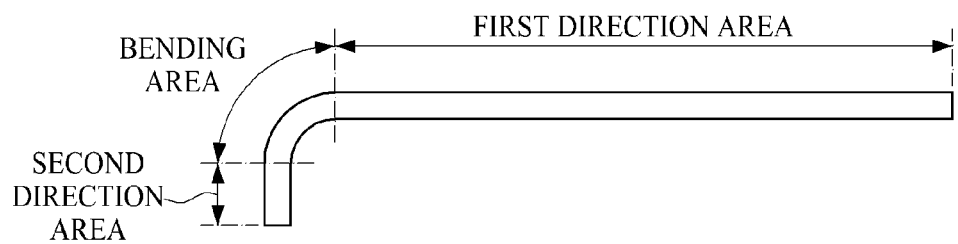
FIG. 12 is a schematic cross-sectional view of a curved display device according to another embodiment of the present invention.

FIG. 12 is a schematic cross-sectional view of a curved display device according to another embodiment of the present invention.

In the above-described curved display device of FIG. 5, the bending area and the second direction area are respectively formed at one side and the other side of the first direction area.

On the other than, in the curved display device of FIG. 12, the bending area and the second direction area are respectively formed at only one side of the first direction area.

Figure 13:
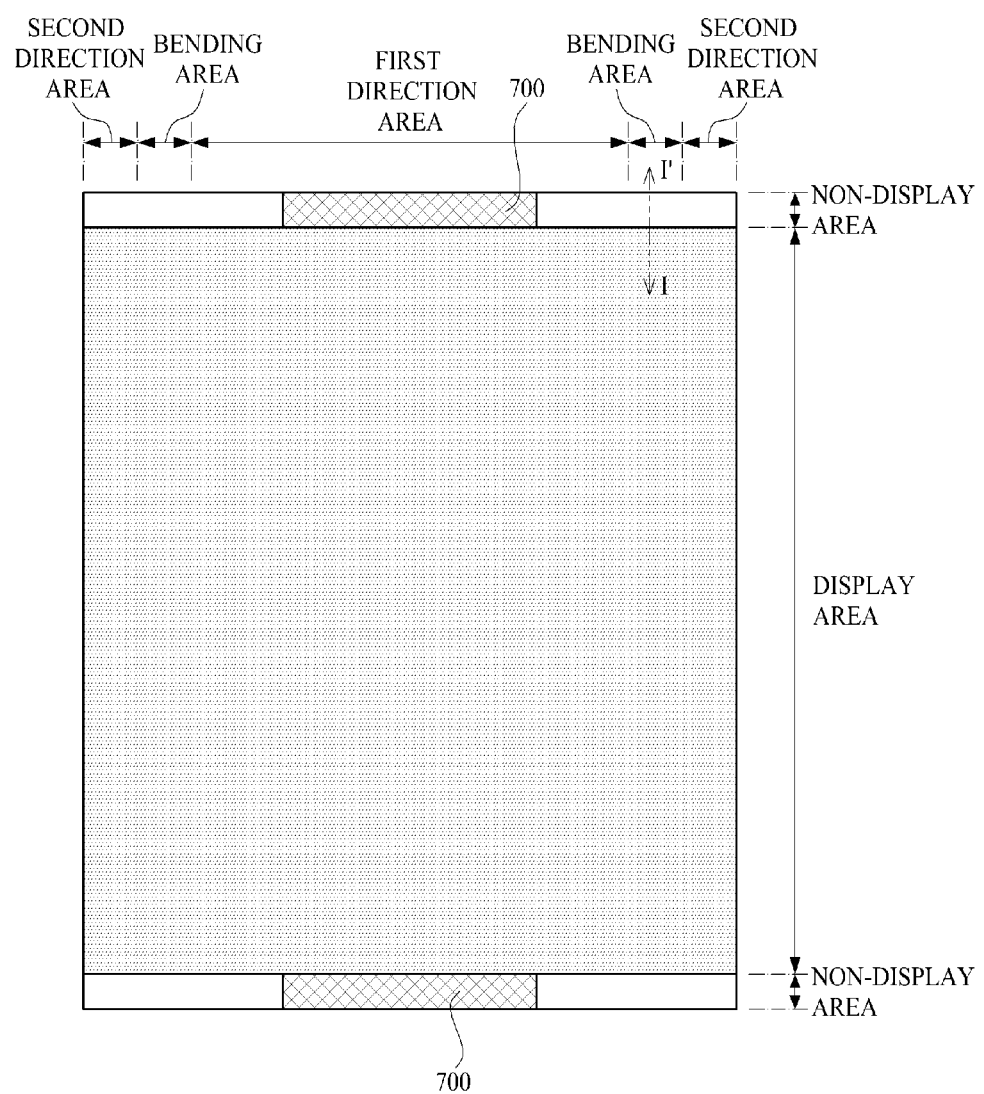
FIG. 13 is a schematic plan view of a curved display device according to another embodiment of the present invention.

FIG. 13 is a schematic plan view of a curved display device according to another embodiment of the present invention.

As seen in FIG. 13, the curved display device according to another embodiment of the present invention includes a display area, which displays an image, and a non-display area which cannot display an image. A driver 700 for driving a pixel in the display area is provided in the non-display area. Although it is illustrated in the drawing that the driver 700 is provided at each of an upper end and a lower end of a display device, the driver 700 may be provided at only one selected from the upper end and lower end of the display device.

Figure 14:
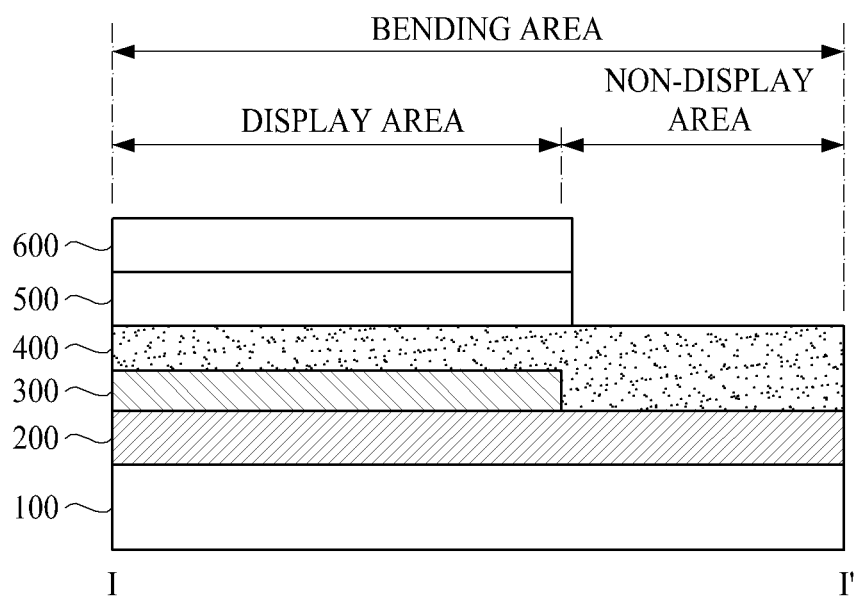
FIG. 14 is a cross-sectional view taken along line I-I' of FIG. 13.

FIG. 14 is a cross-sectional view taken along line I-I' of FIG. 13. That is, FIG. 14 illustrates a cross-sectional surface of a display area/non-display area overlapping a bending area. Similarly, the following cross-sectional views according to various embodiments also illustrate a cross-sectional surface of a display area/non-display area overlapping a bending area. Hereinafter, a display area overlapping a bending area is simply referred to as a display area, and a non-display area overlapping the bending area is simply referred to as a non-display area.

As seen in FIG. 14, an organic light emitting display device according to another embodiment of the present invention includes a base substrate 100, a TFT layer 200, an light emitting diode layer 300, a passivation layer 400, a sealing layer 500, and an upper film 600.

In this case, the TFT layer 200, the light emitting diode layer 300, the passivation layer 400, the sealing layer 500, and the upper film 600 are sequentially formed on the base substrate 100 in the display area, but in the non-display area, the TFT layer 200 and the passivation layer 400 are sequentially formed on the base substrate 100. Therefore, according to FIG. 14, a thickness difference occurs between the display area and the non-display area. When the thickness difference occurs between the display area and the non-display area, a crack can occur in the non-display area when bending a display device. Therefore, a method for solving a problem in which the crack occurs in the non-display area is needed, and will be described through a below-described embodiment.

Figure 15:
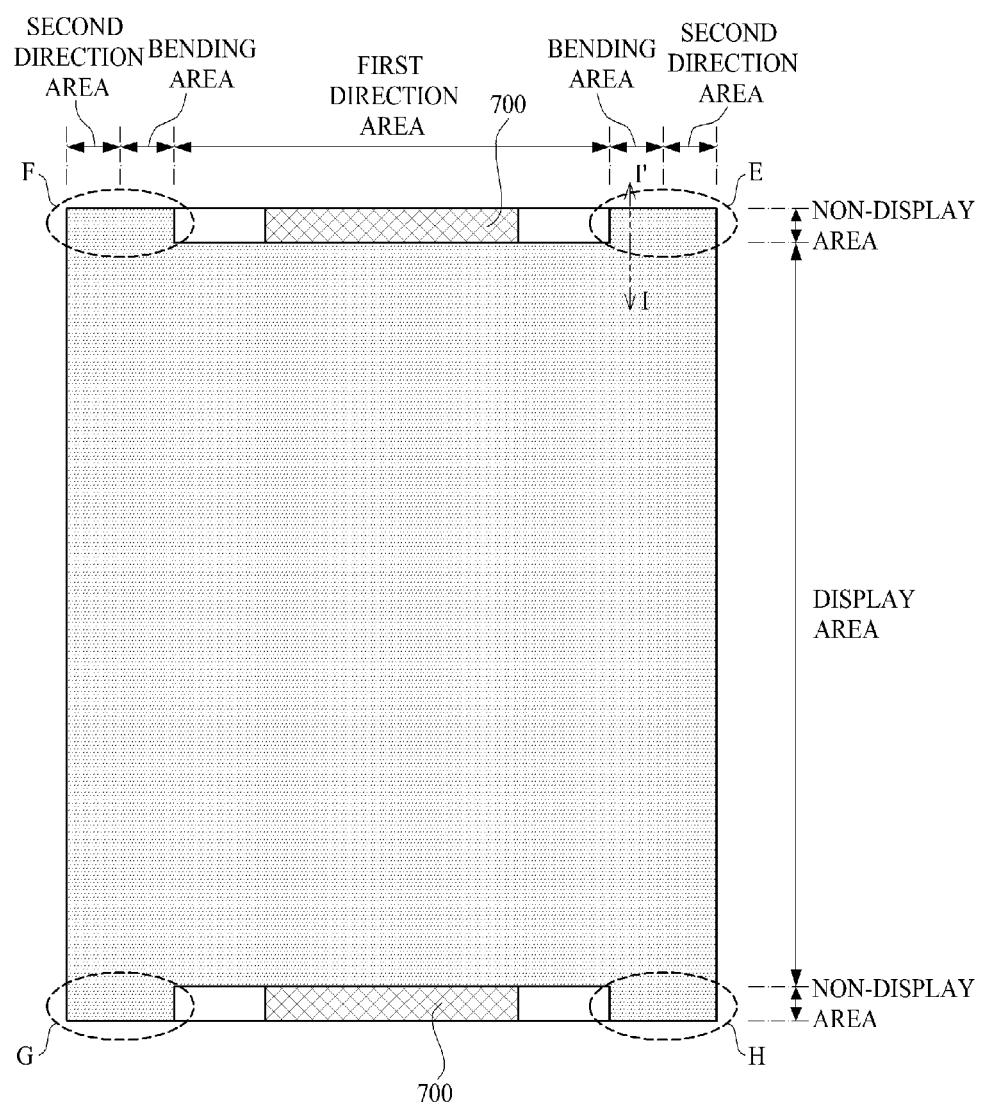
FIG. 15 is a schematic plan view of a curved display device according to another embodiment of the present invention.

FIG. 15 is a schematic plan view of a curved display device according to another embodiment of the present invention. A sealing layer 500 and an upper film 600 extend to the non-display area. In FIG. 15, a dotted line illustrates an area in which the sealing layer 500 and the upper film 600 are formed.

According to FIGS. 13 and 14, since the sealing layer 500 and the upper film 600 are not formed in an area where the non-display area overlaps the bending area, a crack can occur in the area, where the non-display area overlaps the bending area, in a bending process.

On the other hand, in FIG. 15, the sealing layer 500 and the upper film 600 extend to areas E, F, G and H where the non-display area overlaps the bending area, and thus, a crack can be prevented from occurring in the bending process.

Moreover, as illustrated, the sealing layer 500 and the upper film 600 may extend to an area where the non-display area overlaps the second direction area. Also, although not shown, the sealing layer 500 and the upper film 600 may extend to an area where the non-display area overlaps the first direction area.

Figure 16:
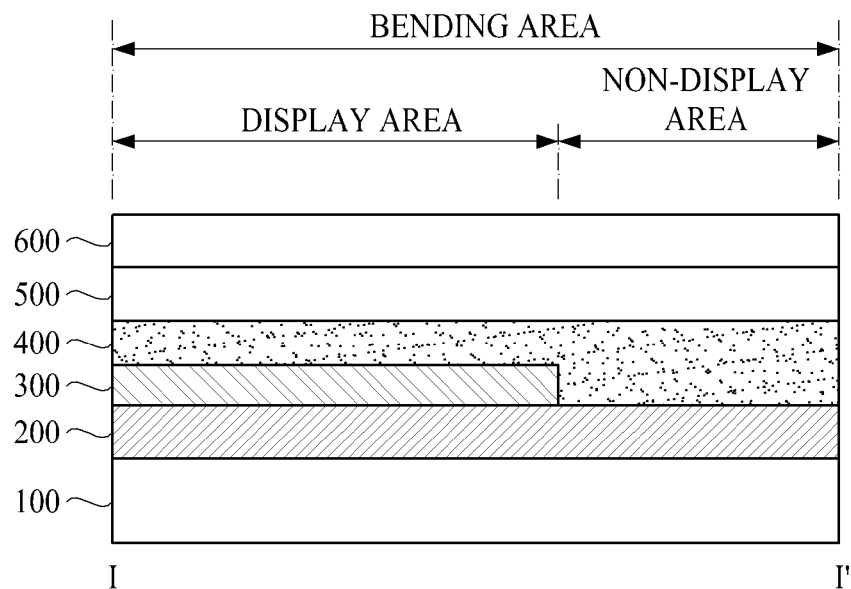
FIGS. 16 and 17 are cross-sectional views according to various embodiments of line I-I' of FIG. 15.
Figure 17:
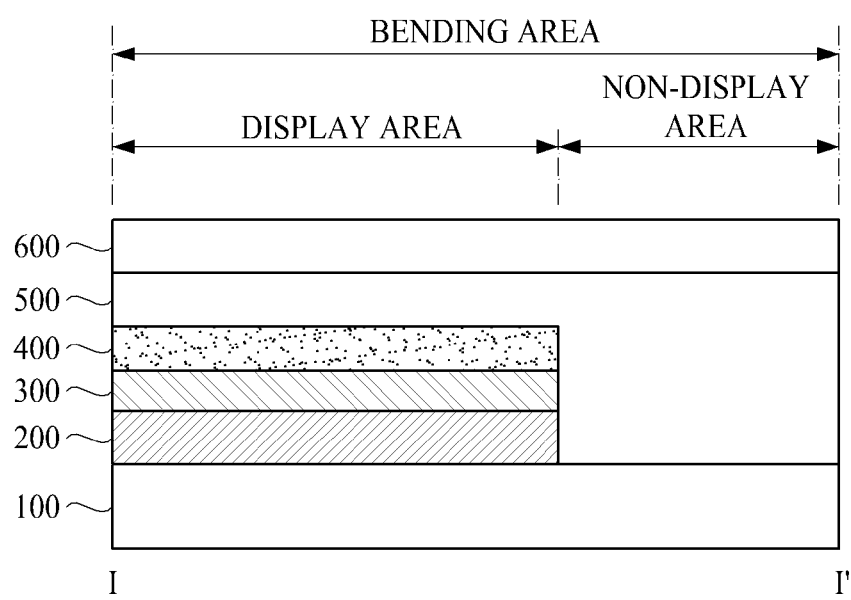

FIGS. 16 and 17 are cross-sectional views according to various embodiments of line I-I' of FIG. 15.

As seen in FIGS. 16 and 17, a curved display device according to another embodiment of the present invention includes a base substrate 100, a TFT layer 200, a light emitting diode layer 300, a passivation layer 400, a sealing layer 500, and an upper film 600.

In this case, the TFT layer 200, the light emitting diode layer 300, the passivation layer 400, the sealing layer 500, and the upper film 600 are sequentially formed on the base substrate 100 in the display area. Also, in the non-display area, as illustrated in FIG. 16, the TFT layer 200, the passivation layer 400, the sealing layer 500, and the upper film 600 may be sequentially formed on the base substrate 100, and as illustrated in FIG. 17, the sealing layer 500 and the upper film 600 may be sequentially formed on the base substrate 100. Although not shown, in FIG. 17, one selected from the TFT layer 200 and the passivation layer 400 extends to the non-display area.

According to FIGS. 16 and 17, a thickness difference does not occur between the display area and the non-display area. Therefore, a crack can be prevented from occurring in the non-display area in bending a display device.

Figure 18:
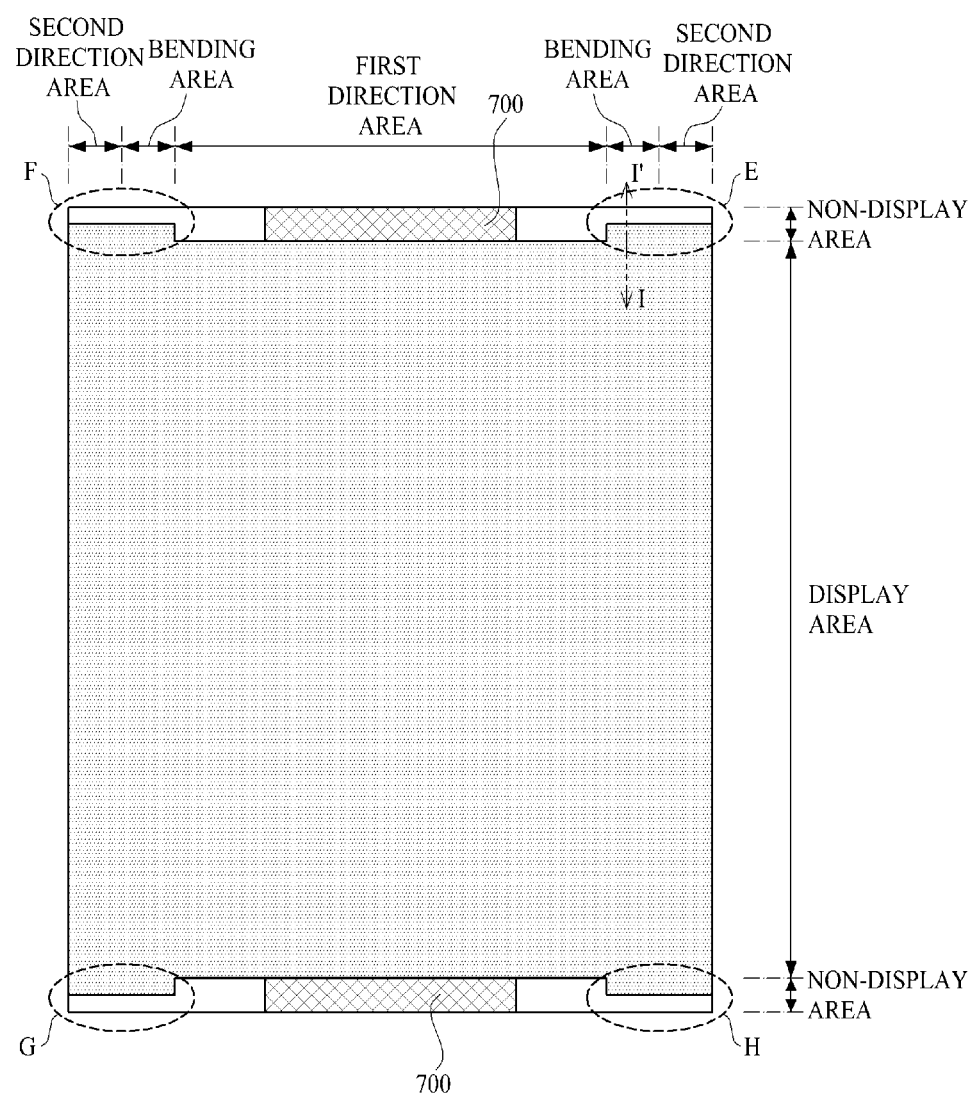
FIG. 18 is a schematic plan view of a curved display device according to another embodiment of the present invention.

FIG. 18 is a schematic plan view of a curved display device according to another embodiment of the present invention. In FIG. 18, a sealing layer 500 and an upper film 600 extend to the non-display area. In FIG. 18, a dotted line illustrates an area in which the sealing layer 500 and the upper film 600 are formed. In FIG. 15, the sealing layer 500 and the upper film 600 extends to an end of the non-display area. In FIG. 18, the sealing layer 500 and the upper film 600 does not extend to the end of the non-display area.

In FIG. 18, since the sealing layer 500 and the upper film 600 does not extend to the end of the non-display area, a thickness of the display area differs from that of the non-display area. However, by changing configurations of the TFT layer 200 and the passivation layer 400, a crack transfer preventing part is provided in the non-display area. Therefore, a crack of the non-display area can be prevented from being transferred to the display area. This will be described with reference to a below-described cross-sectional view.

FIGS. 19 to 25 are cross-sectional views according to various embodiments of line I-I' of FIG. 18.

Figure 19:
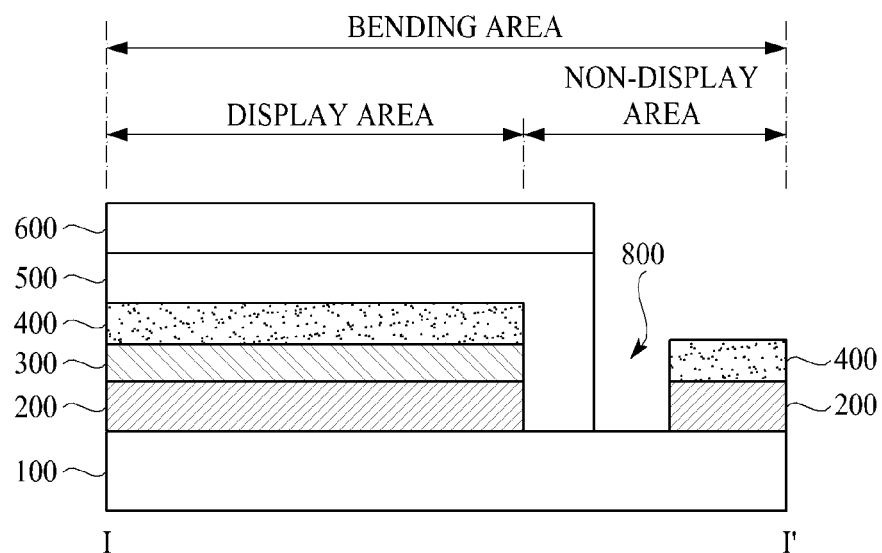
FIGS. 19 to 25 are cross-sectional views according to various embodiments of line I-I' of FIG. 18.

As seen in FIG. 19, a TFT layer 200, a light emitting diode layer 300, a passivation layer 400, a sealing layer 500, and an upper film 600 are sequentially formed on a base substrate 100 in the display area, and the sealing layer 500 and the upper film 600 extend to a portion of the non-display area. Also, the TFT layer 200 and the passivation layer 400 are formed in the non-display area.

In this case, the TFT layer 200 and the passivation layer 400 which are formed in the display area are separated from a TFT layer 200 and a passivation layer 400, which are formed in the non-display area, with a crack transfer preventing part 800 therebetween. Therefore, the crack transfer preventing part 800 which exposes the base substrate 100 is included in the non-display area. Even when a crack occurs in the non-display area, the crack transfer preventing part 800 prevents the crack from being transferred to the display area. The crack transfer preventing part 800 may be formed of groove in a straight line or a curved line, and may be formed by a combination of a plurality of separated holes.

Figure 20:
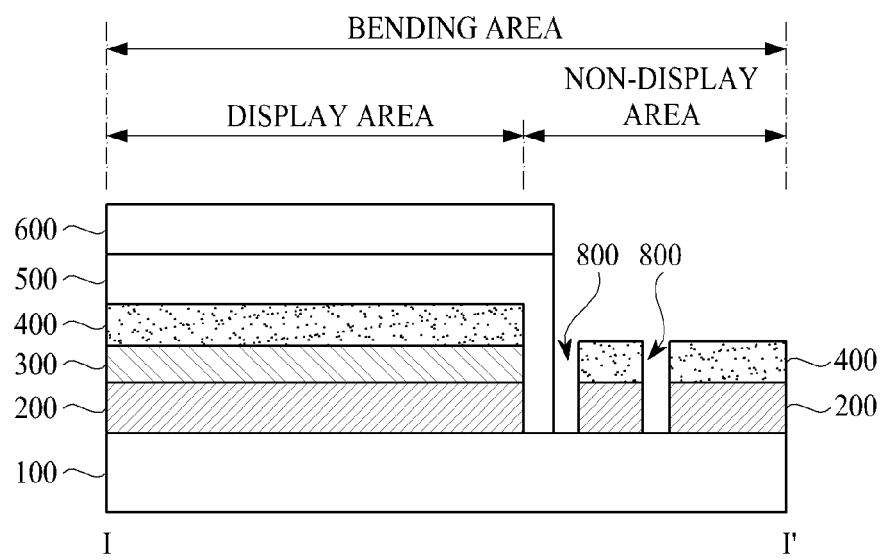

FIG. 20 is a state in which the crack transfer preventing part 800 of FIG. 19 is provided in plurality. Two the crack transfer preventing parts 800 are illustrated in FIG. 20, but three or more the crack transfer preventing parts 800 may be formed.

Figure 21:
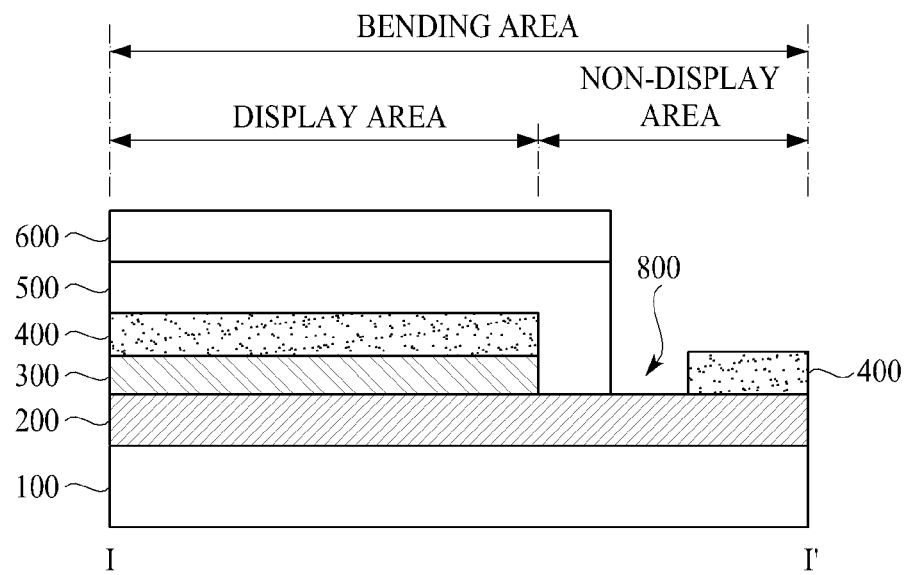

FIG. 21 illustrates that a TFT layer 200 is additionally formed at the crack transfer preventing part 800 in a device of FIG. 19. That is, according to FIG. 21, the crack transfer preventing part 800 is formed by separating a passivation layer 400 in the display area from a passivation layer 400 in the non-display area, and the TFT layer 200 is exposed to the crack transfer preventing part 800.

Figure 22:
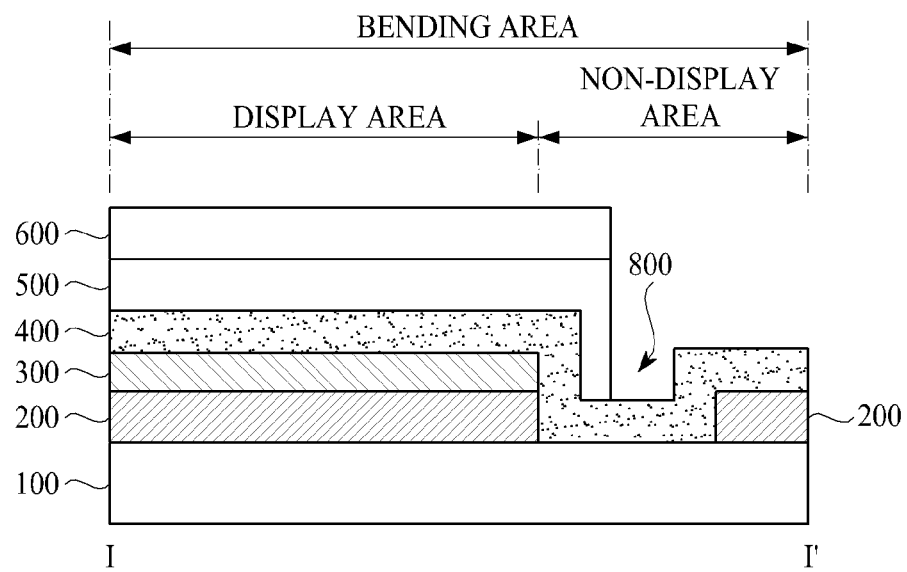

FIG. 22 illustrates that a passivation layer 400 is additionally formed at the crack transfer preventing part 800 in the device of FIG. 19. That is, according to FIG. 22, the crack transfer preventing part 800 is formed by separating a TFT layer 200 in the display area from a TFT layer 200 in the non-display area, and the passivation layer 400 is exposed to the crack transfer preventing part 800.

Figure 23:
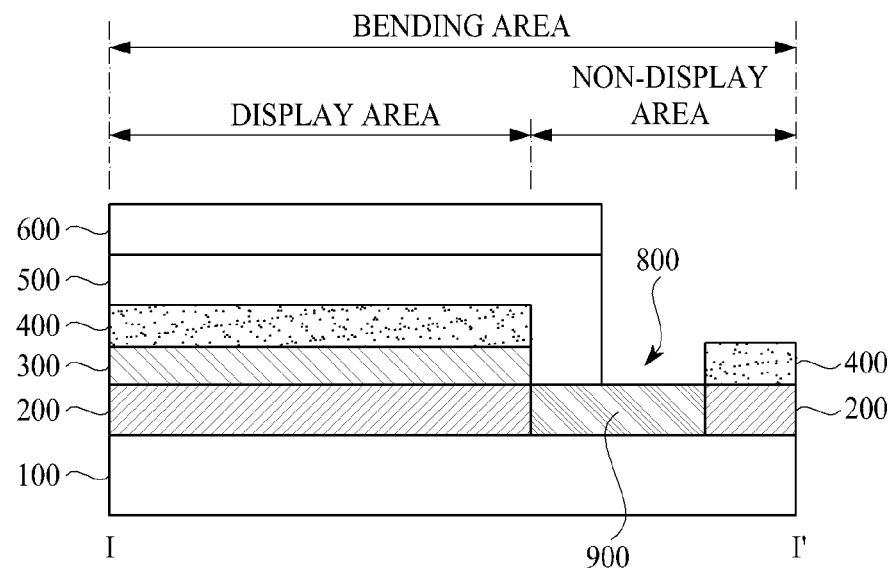

FIG. 23 illustrates that a metal layer 900 is additionally formed at the crack transfer preventing part 800 in the device of FIG. 19. That is, according to FIG. 23, the metal layer 900 is formed on a base substrate 100 exposed by the crack transfer preventing part 800. The metal layer 900 is formed of metal, having good ductility, such as aluminum (Al) or copper (Cu). Therefore, even when a crack occurs in the non-display area, the metal layer 900 can prevent the crack from being transferred to the display area.

Figure 24:
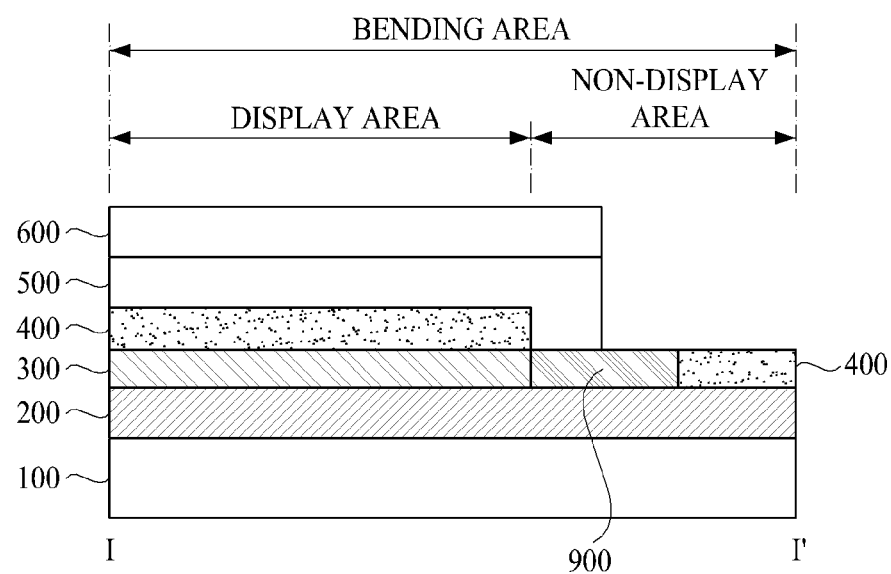

FIG. 24 illustrates that a metal layer 900 is additionally formed at the crack transfer preventing part 800 in a device of FIG. 21. That is, according to FIG. 24, the metal layer 900 formed of metal (having good ductility) such as Al or Cu is formed on a TFT layer 200 exposed by the crack transfer preventing part 800.

Figure 25:
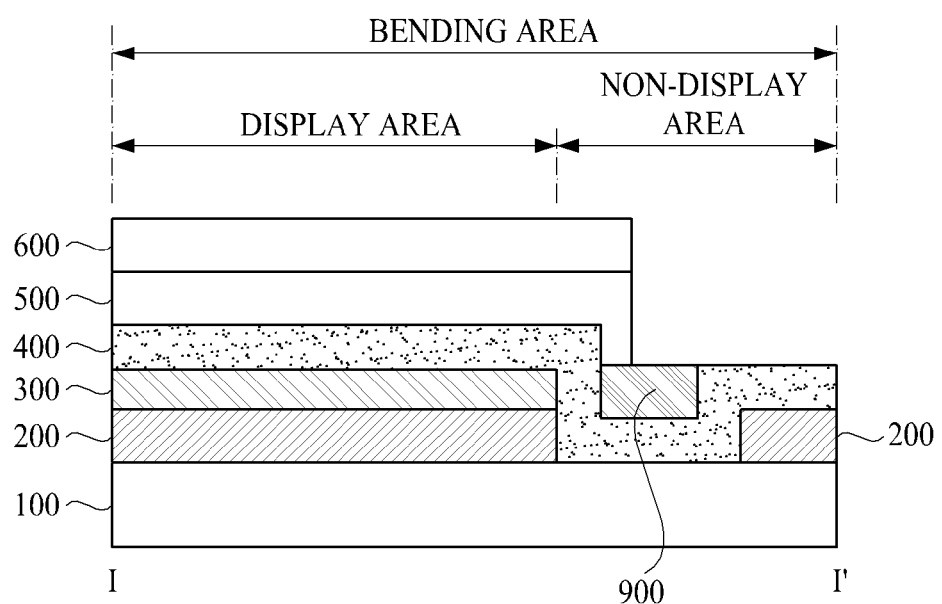

FIG. 25 illustrates that a metal layer 900 is additionally formed at the crack transfer preventing part 800 in a device of FIG. 22. That is, according to FIG. 25, the metal layer 900 formed of metal (having good ductility) such as Al or Cu is formed on a passivation layer 400 exposed by the crack transfer preventing part 800.

FIGS. 2 to 12 illustrate a configuration of the display area, and FIGS. 13 to 25 illustrate a configuration of the non-display area. The configuration of the display area according to embodiments of the present invention is not limited to FIGS. 2 to 12, and may be variously changed.

Hereinabove, the display device including the first direction area, the bending area, and the second direction area has been described, but the second direction area may be omitted depending on the case.

Moreover, the organic light emitting display device has been described above as an example of the display device, but the present invention is not limited to the organic light emitting display device. Examples of the display device include various display devices (for example, a liquid crystal display (LCD) device) known to those skilled in the art.

As described above, according to the embodiments of the present invention, the sealing layer and the upper film extend to an area in which the non-display area overlaps the bending area, thereby preventing a crack from occurring in a manufacturing process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A curved display device including a display area and a non-display area in a substrate, the curved display device comprising:
    a first direction area having a first flat front surface;
    a second direction area having a second flat front surface,
    a bending area connecting the first flat surface with the second flat surface,
    wherein the first and second flat front surfaces remain flat when the bending area is bent, and the first and second flat front surfaces are not parallel when the bending area is bent,
    wherein a thin film transistor (TFT) layer, a passivation layer, a sealing layer, and an upper film are included on a base substrate in a portion of the display area in each of the bending area and the first direction area,
    wherein extended portions of the sealing layer and the upper film extend toward an end of the substrate in both the bending area and the first direction area,
    wherein the sealing layer and the upper film extend to an area where the non-display area overlaps the bending area,
    wherein the extended portions of the sealing layer and the upper film in the bending area are closer to the end of the substrate than the extended portions of the sealing layer and the upper film in the first direction area, and
    wherein a crack transfer preventing part is provided in a portion of the non-display area in the bending area.

2. The curved display device of claim 1, wherein the sealing layer and the upper film extend to an end of the non-display area.

3. The curved display device of claim 1, wherein a thickness of a portion of the display area in the bending area is equal to a thickness of a portion of the non-display area in the bending area.

4. The curved display device of claim 1, wherein the sealing layer and the upper film do not extend to an end of the non-display area.

5. The curved display device of claim 1, wherein a second TFT layer and a second passivation layer are provided in a portion of the non-display area in the bending area, and
    wherein the TFT layer and the passivation layer, which are provided in the display area in the bending area, are separated from the second TFT layer and the second passivation layer in the non-display area in the bending area with the crack transfer preventing part therebetween.

6. The curved display device of claim 1, wherein one selected from the base substrate, the TFT layer, and the passivation layer is exposed to the crack transfer preventing part.

7. The curved display device of claim 1, wherein a metal layer is included in the crack transfer preventing part.

8. The curved display device of claim 1, wherein the sealing layer and the upper film extend to a portion of the non-display area in the second direction area.

9. The curved display device of claim 1, wherein the first direction area comprises a first pixel configured to include a line and a TFT for displaying an image, and
    wherein the bending area does not include a pixel for displaying an image, or comprises a second pixel including a configuration which differs from a configuration of the first pixel.

10. The curved display device of claim 1, wherein the first direction area includes a plurality of pixels arranged in a matrix, and wherein a width of the bending area is greater than a width of a pixel of the first direction area.

11. The curved display device of claim 1, wherein the first direction area includes a plurality of first pixels arranged in a matrix, and
    wherein the bending area includes no pixels or a plurality of second pixels having a pixel configuration different than the first pixels.

12. The curved display device of claim 1, wherein the first direction area includes a plurality of first pixels arranged in a matrix, and
    wherein the bending area includes a plurality of second pixels having a pixel configuration different than the first pixels.

13. The curved display device of claim 1, wherein the crack transfer preventing part includes at least one portion where the base substrate is exposed.

14. The curved display device of claim 1, wherein the crack transfer preventing part includes at least one portion where one of the base substrate, the TFT layer, and the passivation layer is exposed.

15. The curved display device of claim 1, wherein the crack transfer preventing part includes a metal layer directly in contact with the base substrate.

16. The curved display device of claim 1, wherein the crack transfer preventing part includes a metal layer directly in contact with the TFT layer.

* * * * *